United States Patent
Sedlak

(10) Patent No.: US 9,135,220 B2
(45) Date of Patent: Sep. 15, 2015

(54) DIGITAL FILTER FOR REDUCING THE SAMPLING RATE OF AN INPUT SIGNAL

(71) Applicant: MBDA Deutschland GmbH, Schrobenhausen (DE)

(72) Inventor: Gerhard Sedlak, Bernau am Chiemsee (DE)

(73) Assignee: MBDA Deutschland GmbH, Schrobenhausen (DE)

( * ) Notice: Subject to any disclaimer, the term of this patent is extended or adjusted under 35 U.S.C. 154(b) by 292 days.

(21) Appl. No.: 13/900,597

(22) Filed: May 23, 2013

(65) Prior Publication Data

US 2013/0318140 A1 Nov. 28, 2013

(30) Foreign Application Priority Data

May 24, 2012 (DE) .......................... 10 2012 010 229

(51) Int. Cl.
*G06F 17/10* (2006.01)
*H03H 17/06* (2006.01)

(52) U.S. Cl.
CPC ........... *G06F 17/10* (2013.01); *H03H 17/0664* (2013.01); *H03H 17/0671* (2013.01)

(58) Field of Classification Search
CPC .................. H03H 17/0416–17/0455; H03H 17/0621–17/0685

USPC ................................................... 708/300–323
See application file for complete search history.

(56) References Cited

U.S. PATENT DOCUMENTS

| | | | | |
|---|---|---|---|---|
| 5,596,609 | A * | 1/1997 | Genrich et al. | 375/350 |
| 7,196,648 | B1 * | 3/2007 | Ding et al. | 341/144 |
| 7,788,309 | B2 * | 8/2010 | Wu et al. | 708/313 |
| 2004/0093366 | A1 | 5/2004 | Gagnon et al. | |

OTHER PUBLICATIONS

German Office Action dated Feb. 27, 2013 (five (5) pages).

* cited by examiner

*Primary Examiner* — Chuong D Ngo
*Assistant Examiner* — Andrew J Campbell
(74) *Attorney, Agent, or Firm* — Crowell & Moring LLP

(57) ABSTRACT

A digital filter for reducing a sampling rate for an input signal includes a parallelizing block for splitting the input signal into at least two parallel raw signals, an integration block for converting the parallel raw signals into an intermediate signal, and a differentiation block for generating an output signal by differentiating the intermediate signal. The integration block includes a logic block that is designed for generating two parallel sum signals from the parallel raw signals using summation operations, and a recursion block that is designed for generating the intermediate signal recursively from the parallel sum signals.

18 Claims, 3 Drawing Sheets

DIGITAL FILTER FOR REDUCING THE SAMPLING RATE OF AN INPUT SIGNAL

CROSS-REFERENCE TO RELATED APPLICATIONS

This application claims priority under 35 U.S.C. §119 to German Patent Application No. 10 2012 010 229.1, filed May 24, 2012, the entire disclosure of which is herein expressly incorporated by reference.

FIELD OF THE INVENTION

Exemplary embodiments of the present invention relate to a digital filter and a method for reducing a sampling rate of an input signal and further relates to a radar sensor for a missile.

BACKGROUND OF THE INVENTION

CIC filters (cascaded integrator comb filters, combination integrator comb filters, or cascaded integrator differentiator filters), which are simple and cost-effective to create, are frequently used in digital signal processing, especially with respect to the sampling rate for narrow bandwidths. In many digital filters, CIC filters are also used in combination with FIR filters for anti-aliasing of signals.

U.S. Patent Application Publication US2004/0093366 A1 discloses a digital filter ("Infinite Impulse Response" Filter) that can work with parallelized sample signals and can be used as an integrator in a CIC filter.

SUMMARY OF THE INVENTION

As a rule, the standard algorithm for CIC filters cannot be used if the parallelized sampling values have to be further processed downstream of an analog/digital converter, for instance, if the sampling rate is too high for the signal processing hardware.

Exemplary embodiments of the present invention are directed to a digital CIC filter that may also be used with standard hardware at very high sampling rates.

One aspect of the invention relates to a digital filter for reducing a sampling rate of a signal, for instance an input signal, that is produced by an analog/digital converter with a high sampling rate. The filter generates an output signal with a lower sampling rate (for instance a sampling rate that is lower by at least a factor of 4), and the output signal is fed to a digital function that can work with the lower sampling rate.

It must be understood that the input signal, the output signal, and all of the digital signals mentioned in the following are digital signals, that is, they can only have discrete signal levels. A sampling rate may be defined in that each discrete signal level may change only after a pre-defined discrete increment of time (the inverse of the sampling rate).

In accordance with one embodiment of the invention, the digital filter includes a parallelizing block for splitting the input signal into at least two parallel raw signals, at least one integration block for converting the parallel raw signals into an intermediate signal, and at least one differentiation block for generating an output signal by differentiating the intermediate signal. The integration block includes a logic block that is designed for generating two parallel sum signals from the parallel raw signals using summation operations. The integration block further includes a recursion block that is designed for generating the intermediate signal recursively from the parallel sum signals.

Instead of processing a serial signal with a conventional CIC filter, for instance four parallel raw signals are generated from the serial input signal, and these, by means of the integration block that is designed for executing a recursion algorithm, are then converted to an intermediate signal exactly like that which could be generated by a conventional CIC filter (function upstream of the differentiation block). In this manner the CIC filter effect may be attained, for instance, for four-fold parallelized sampling values.

The filter may be used with a very high sampling rate in digital circuits in which it may be necessary to parallelize the sampling values in the hardware for further processing. Since the integration block and the differentiation block may be operated at a lower sampling rate, the filter may be realized with relatively little complexity.

In accordance with one embodiment of the invention, the parallel sum signals at a sampling time are generated from the parallel raw signals at the same sampling time. Thus the logic block can generate these parallel sum signals without caching signals and/or executing a recursion.

In accordance with one embodiment of the invention, the logic block is designed for generating (exactly) two parallel sum signals $S_0$ and $S_1$, especially in accordance with $$S_0(i) = \sum_{e=0}^{E-1} u_e(i),$$

$i = 1, 2, \ldots$ and $$S_1(i) = E \cdot u_0(i) + \ldots + 2 \cdot u_{E-2}(i) + u_{E-1}(i),$$

$i = 1, 2, \ldots,$ wherein $u_e(i)$ is the parallel raw signals and E is the number of parallel raw signals. As is explained in even greater detail below, it is possible to generate from these two sum signals, by means of recursion, an intermediate signal that is the equivalent of the intermediate signal of a conventional CIC filter upstream of the differentiation block.

In accordance with one embodiment of the invention, the recursion block is designed for generating the intermediate signal at a sampling time from the parallel sum signals at this sampling time and at least one preceding sampling time. In other words, the recursion block is able to cache recursion signals or signals derived therefrom.

In accordance with one embodiment of the invention, the recursion block is designed for generating the intermediate signal at a sampling time from the parallel sum signals at the sampling time and (only) from the parallel sum signals that were delayed by one or two time units. In this manner the intermediate signal may be generated using a relatively simple calculation that involves only a few logic operations (such as adding, subtracting, and caching).

In accordance with one embodiment of the invention, the recursion block is designed for generating the intermediate signal $S_R$ in accordance with $$S_R(i) = S_R(i-1) + S_1(i) + E \cdot S_0(i-2) + E \cdot S_0(i-1), i = 3, 4, \ldots$$

wherein $S_0$ and $S_1$ are the sum signals and E is the number of parallel raw signals. This recursion formula is further derived below. The recursion block may thus generate the intermediate signal with caching only two times. In addition, only multiplication with one scalar and no more than four addition operations are necessary.

In accordance with one embodiment of the invention, the parallelizing block is designed for splitting the input signal into at least four, for instance exactly four, parallel raw signals. In this manner the subsequent logic may work with only one-quarter of the original sampling rate.

In accordance with one embodiment of the invention, the differentiation block has two serially arranged differentiation stages that are designed for subtracting the intermediate signal, which is delayed by a pre-defined number of time units, from the non-delayed intermediate signal. This is the equivalent of a differentiation block for a convention CIC filter to which the intermediate signal is forwarded.

In accordance with one embodiment of the invention, the differentiation stages are designed for delaying the intermediate signal by 4 or 8 time units.

In accordance with one embodiment of the invention, the filter is embodied in hardware, for instance by means of an FPGA. Since the hardware can work with a lower sampling rate than that of the input signal, cost-effective standard hardware may be used here. All or some of the blocks or logic of the digital filter may be realized as operational components of the FPGA.

Another aspect of the invention relates to the radar sensor for a missile, for instance a guided missile or a military missile.

In accordance with one embodiment of the invention, the missile includes a radar receiver, an A/D converter for converting an analog signal from the radar receiver to a digital signal, and a digital signal processor. The digital signal processor, which may be an electronic component, includes a digital filter for reducing the sampling rate for the digital signal as is described in the foregoing and below. The missile may acquire a potential target by means of the radar sensor and then be guided toward this target with the evaluated signals.

Another aspect of the invention relates to methods for reducing a sampling rate of an input signal. For instance the method may be performed with the digital filter.

In accordance with one embodiment of the invention, the method includes the steps: splitting the input signal into at least two parallel raw signals; adding the parallel raw signals to two parallel sum signals; recursively generating an intermediate signal from the parallel sum signals; and generating an output signal by differentiating the intermediate signal.

It is understood that features of the digital filter and the missile may be features of the method and vice versa.

Exemplary embodiments of the invention are described in detail in the following and refer to the enclosed figures.

BRIEF DESCRIPTION OF THE FIGURES

Identical or similar parts are labeled with the same reference number.

DETAILED DESCRIPTION OF EXEMPLARY EMBODIMENTS

Figure 1:
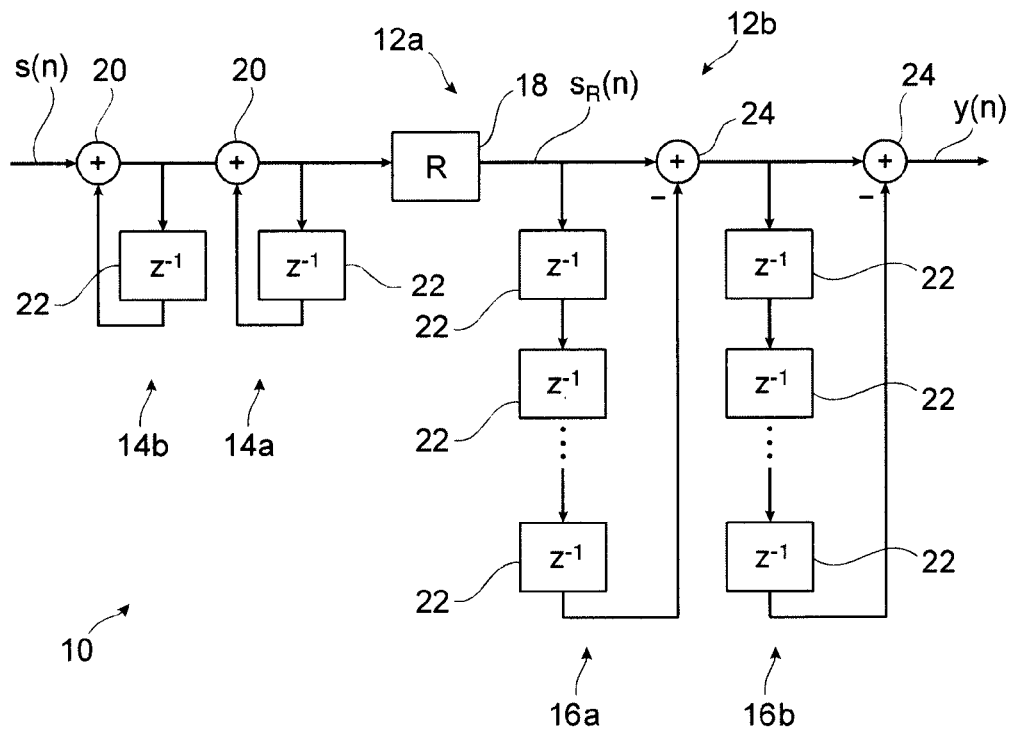
FIG. 1 diagrams the structure of a CIC filter.

FIG. 1 depicts a conventional CIC filter 10 that includes two stages 12a, 12b. The first (inner) stage 12a includes a first integration block 14a and a first differentiation block 16a. The second (outer) stage 12b includes a second integration block 14b and a second differentiation block 16b. The two stages 12a, 12b are arranged nested in one another. It is understood that the CIC filter 10 may also have more than two stages 12a, 12b, the stages then being nested within one another.

A reduction block 18 for reducing the sampling rate is arranged between the first integration block 14a and the first differentiation block 16a. An input signal s(n) (n is a discrete point in time) passes through the integration blocks 14b, 14a, the reduction block 18, and the differentiation blocks 16a, 16b, so that an output signal y(n) occurs through the CIC filter 10.

The integration blocks 14a, 14b include an addition block 20 and a time delay block 22. In this manner the input signal x(n) is and the input signal x(n-1) of a discrete prior time interval are first added together in the second integration block 14a.

Each of the differentiation blocks 16a, 16b includes a difference block 24 and a plurality of time delay blocks 22 arranged in series. In the illustrated example D (for instance) these are eight units. In this manner for instance the intermediate signal ($S_R$(n-D)), which was generated D discrete time intervals before, is subtracted in the first differentiation block from the intermediate signal $S_R$(n), which leaves the reduction block 18.

When the reduction block 18 is not taken into account the z transform for a CIC stage (for instance the first CIC stage 12a) is $$H(z) = \frac{Y(z)}{X(z)}$$

$$= \frac{1 - z^{-D}}{1 - z^{-1}}$$

$$= \sum_{k=0}^{D-1} z^{-k}$$

$z = e^{j2\pi f}$ represents the transfer function H(f) as $$H(f) = H(Z)|_{Z=e^{j2\pi}}$$

$$= \frac{1 - e^{-j2\pi fD}}{1 - e^{-j2\pi f}}$$

$$= \frac{e^{-j2\pi fD/2}(e^{-j2\pi fD/2} - e^{-j2\pi fD/2})}{e^{-j2\pi f/2}(e^{-j2\pi f/2} - e^{-j2\pi f/2})}$$

$$= e^{-j2\pi f(D-1)/2} \frac{\sin(\pi fD)}{\sin(\pi f)}$$

The association between or nesting of M CIC stages 12a, 12b leads to the transfer function $H^M$(f).

Figure 2:
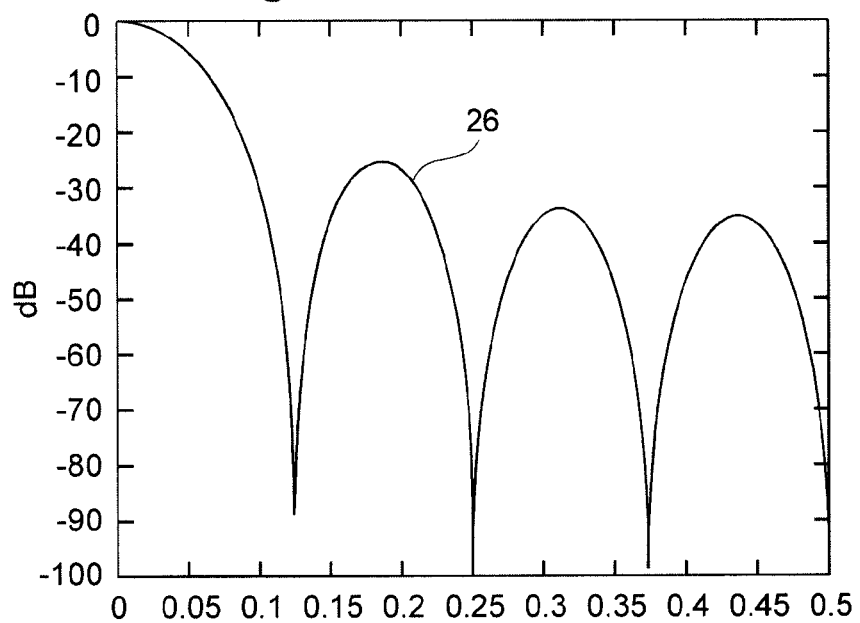
FIG. 2 depicts a transfer function for a digital filter in accordance with one embodiment of the invention.

FIG. 2 illustrates the transfer function 26 for a CIC filter 10 with two stages 12a, 12b and D=8 (R=1). In the diagram in FIG. 2, the frequency is entered to the right (scaling according to the sampling rate) and damping in dB goes up. As may be seen from FIG. 2, the transfer function 26 plots a comb-like shape and dampens periodic areas of a signal. A reduction in the sampling rate using for instance a factor R=4 leads to a periodic repetition of the spectrum in the intervals that are defined by $m*f_s/4$; m=1, 2, . . . , where $f_s$ is the sampling rate. Thus, undesired periodic spectral components may be removed or at least strongly damped by selecting the appropriate CIC filter 10.

In this manner the spectral components that would be folded by changing the sampling rate in the passband of the digital filter (10) (for instance the range with frequencies lower than 0.02) are adequately damped, so that sufficient anti-aliasing may be attained.

Furthermore, damping in the passband of the CIC filter 10 is low so that no compensation is necessary.

Figure 3:
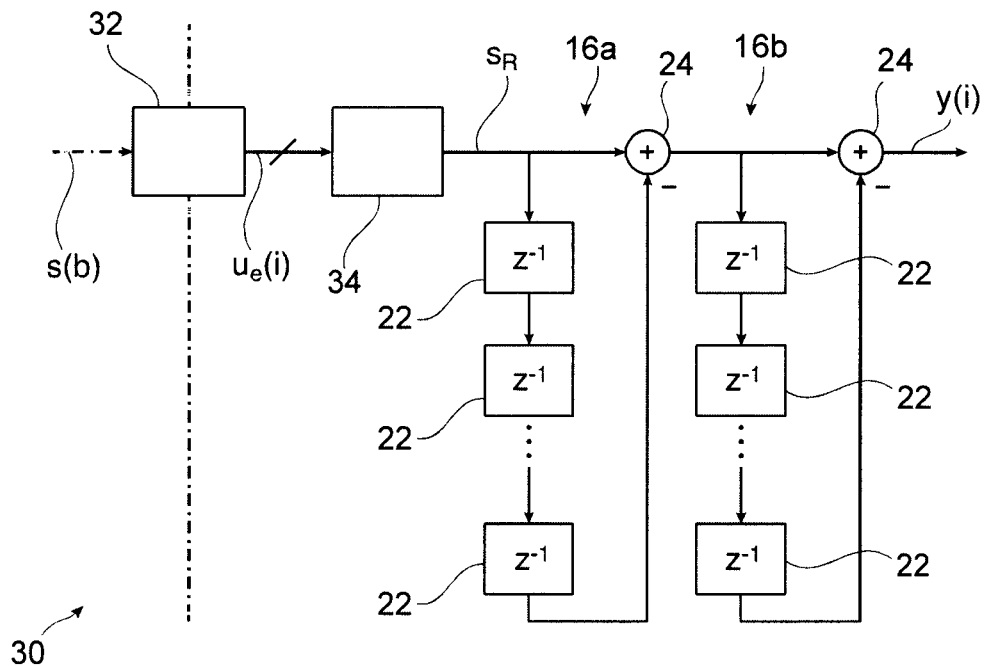
FIG. 3 diagrams the structure of a digital filter in accordance with one embodiment of the invention.

FIG. 3 now depicts a digital reduction filter 30 with which damping may be attained analogous to FIG. 2, but that in contrast to the filter 10 includes a parallelizing block 32 with which the input signal s(k) is split into a plurality of parallel raw signals $u_k(i), k=0, \ldots, E-1$ whose sampling rate is lower by the corresponding factor.

For instance, four (in general E) raw signals $u_k(i)$ are generated from the serial input signal s(k) by the parallelizing block 32, and their sampling rate is lower by the factor 4 (or E). Upstream of the parallelizing block 32 the signal has a sampling rate of $f_s$, and the signals thereafter have sampling rate of $f_s/E$.

In this manner the other components of the filter 30 may be realized with hardware that is merely designed to process a sampling rate $f_s/E$ that is lower than the sampling rate $f_s$ of the input signal s(k) by this factor E. For instance, the input signal s(k) may have a sampling rate of about 1 GHz and the raw signals $u_e(i)$ a sampling rate below 300 MHz or below 200 MHz. Such sampling rates may be process for instance by a conventional FPGA.

In this manner the reduction filter 30 is designed to process both high sampling rates and input signals s(k).

Just like the filter 10, the filter 30 includes two differentiation blocks 16a and 16b that are constructed the same way. However, the two integration blocks 14a and 14b and the reduction block 18 are replaced by the parallelizing block 32 and an integration block 34.

Figure 4:
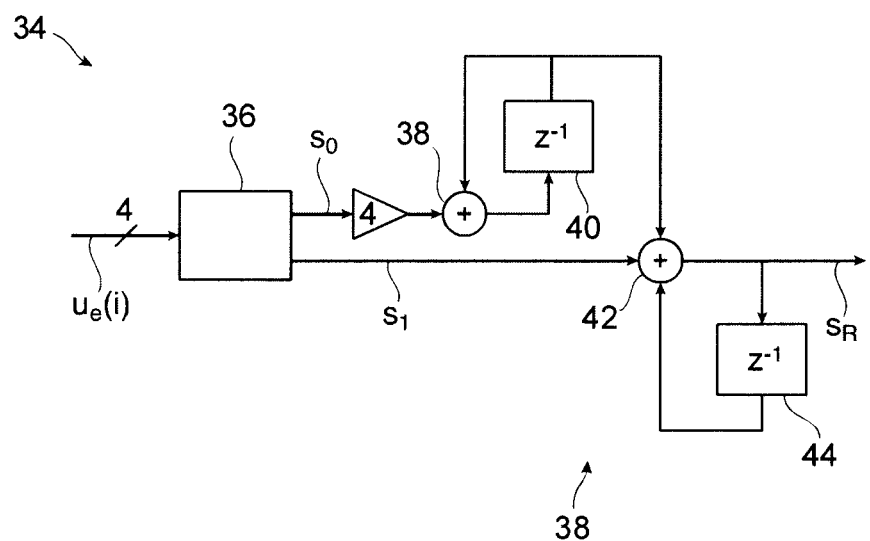
FIG. 4 diagrams an integration block in accordance with one embodiment of the invention.

FIG. 4 illustrates the integration block 34 for the E=4. The four raw signals $u_k(i)$ are fed into a logic block 36 that generates from the four raw signals $u_k(i)$ two sum signals $S_0$ and $S_1$ that are then fed to a recursion block 38. All of the components of the integration block 34 work at a sampling rate of $f_s/4$.

The recursion signal $S_0$ is multiplied by 4, and then fed to an addition block 38. The signal from the addition block 38 with a time-delayed signal from the time-delay block 40, which delays it by one time unit, is added to the original signal.

Similarly, the recursion signal S1 is fed to an addition block 42. The intermediate signal $S_R$ from the addition block 42 with a time-delayed signal from a time-delay block 44, which delays it by one time unit, is added to the original signal. The signal from the time-delay block 40 that is based on the recursion signal $S_0$ is also fed to the addition block 42.

The integration block 34 is now constructed such that it generates from the parallel raw signals $u_e(i)$ the same intermediate signal $S_R$ as the components 14a, 14b, and 18 of the filter 10. This may be derived as follows:

In general these components generate the following signal:

$$S_R(i) = \sum_{n=0}^{E_i-1} \sum_{k=0}^{n} s(k).$$

Integration or summation of the first E parallel sampling values s(k) yields $$\sum_{k=0}^{E-1} s(k) = S_0(1).$$

This formula defines $S_0(1)$.

Integration of the first E sampling values, which occurs twice, yields $$S_R(1) = \sum_{n=0}^{E-1} \sum_{k=0}^{n} s(k)$$
$$= S_1(1)$$

This is the definition of $S_1(1)$. As will be seen later, the intermediate signal $S_R(i)$ may be calculated recursively from these two signals $S_0$, $S_1$.

The following calculations are performed for the sake of clarity only for E=4. Integrating the first eight sampling values twice yields $$S_R(2) = \sum_{n=0}^{7} \sum_{k=0}^{n} s(k)$$
$$= S_R(1) + \sum_{n=4}^{7} \left( \sum_{k=0}^{3} s(k) + \sum_{k=4}^{n} s(k) \right)$$
$$= S_1(1) + 4 \cdot \sum_{k=0}^{3} s(k) + \sum_{n=4}^{7} \sum_{k=4}^{n} s(k)$$
$$S_R(2) = S_R(1) + 4 \cdot S_0(1) + \sum_{n=4}^{7} \sum_{k=4}^{n} s(k)$$
$$= S_R(1) + 4 \cdot S_0(1) + S_1(2)$$

Integrating the first 12 sampling values twice yields $$S_R(3) = \sum_{n=0}^{11} \sum_{k=0}^{n} s(k)$$
$$= S_R(2) + \sum_{n=8}^{11} \left( \sum_{k=8}^{n} s(k) + \sum_{k=0}^{3} s(k) + \sum_{k=4}^{7} s(k) \right)$$
$$= S_R(2) + S_1(3) + 4 \cdot S_0(1) + 4 \cdot S_0(2)$$

Based on this formula, recursive processing of the previously defined signals may be defined (again in general for E raw signals)

$$S_R(1) = S_1(1);$$
$$S_R(2) = S_R(1) + E \cdot S_0(1) + S_1(2);$$
$$S_R(i) = S_R(i-1) + S_1(i) + E \cdot S_0(i-2) + E \cdot S_0(i-1),$$
$$i = 3, 4, \ldots$$

where $$S_0(i) = \sum_{e=0}^{E-1} u_k(i),$$

-continued $$i = 1, 2, \ldots$$

$$S_1(i) = E \cdot u_0(i) + \ldots + 2 \cdot u_{E-2}(i) + u_{E-1}(i),$$

$$i = 1, 2, \ldots$$

$u_e(i)$, e=0, ..., E-1 are the E parallel input signals for the logic block for the $i^{th}$ sampling time of the sampling rate $f_s/E$.

Figure 5:
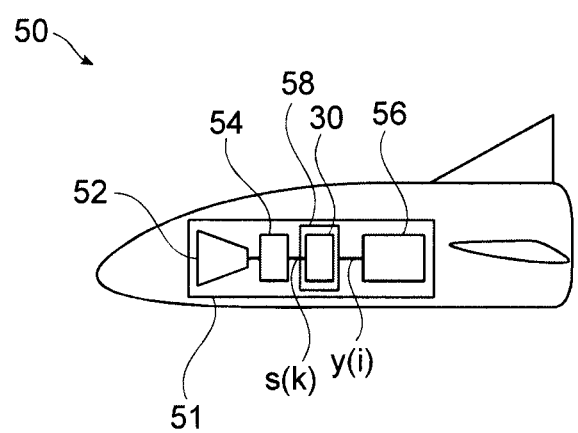
FIG. 5 is a diagram elevation of a missile in accordance with one embodiment of the invention.

FIG. 5 depicts the radar sensor of a guided missile 50 in which the filter 30 may be employed. The guided missile 50 includes a radar sensor 51 that includes a radar receiver 52, an A/D converter 54, a digital signal processor 58, and control electronics 56.

The radar receiver 52 generates an analog signal that the A/D converter 54 converts to a digital signal. This digital signal is fed to the digital signal processor 58, which contains the filter 30 that reduces the signal s(k) for instance to ¼ of the sampling rate and converts it to the signal y(i). The output signal from the digital signal processor 58 can then be further processed in the control electronics 56 of the guided missile 50.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A digital filter, the digital filter comprising:
a parallelizing hardware block configured to split an input signal into at least two parallel raw signals $u_e$;
an integration hardware block configured to convert the parallel raw signals $u_e$ into an intermediate signal $S_R$;
a differentiation hardware block configured to generate an output signal by differentiating the intermediate signal $S_R$;
wherein the integration hardware block includes a logic block configured to generate two parallel sum signals $S_0$ and $S_1$ in accordance with $$S_0(i) = \sum_{e=0}^{E-1} u_e(i),$$

$$i = 1, 2, \ldots$$

and $$S_1(i) = E \cdot u_0(i) + \ldots + 2 \cdot u_{E-2}(i) + u_{E-1}(i),$$

$$i = 1, 2, \ldots$$

from the parallel raw signals $u_e$ using summation operations, wherein $u_e(i)$ is the parallel raw signals and E is the number of parallel raw signals, and
wherein the integration hardware block includes a recursion block configured to generate the intermediate signal $S_R$ recursively from the parallel sum signals $S_0$ and $S_1$,
wherein the digital filter is configured to reduce a sampling rate of the input signal.

2. The filter in accordance with claim 1, wherein the parallel sum signals $S_0$ and $S_1$ at a sampling time are generated from the parallel raw signals at the same sampling time.

3. The filter in accordance with claim 1, wherein the recursion block is configured to generate the intermediate signal $S_R$ at a sampling time from the parallel sum signals $S_0$ and $S_1$ at the sampling time and at least one preceding sampling time.

4. The filter in accordance with claim 1, wherein the parallel sum signals $S_0$ and $S_1$ are delayed by one or two time units, and wherein the recursion block is configured to generate the intermediate signal $S_R$ at a sampling time from the parallel sum signals $S_0$ and $S_1$ at the sampling time and from the parallel sum signals $S_0$ and $S_1$ that are delayed by the one or two time units.

5. The filter in accordance with claim 1, wherein the recursion block is configured to generate the intermediate signal $S_R$ in accordance with $$S_R(i) = S_R(i-1) + S_1(i) + E \cdot S_0(i-2) + E \cdot S_0(i-1), i=3,4,\ldots$$

wherein $S_0$ and $S_1$ are the recursion signals and E is the number of parallel raw signals $u_e$.

6. The filter in accordance with claim 1, wherein the parallelizing block is configured to split the input signal into at least four parallel raw signals $u_e$.

7. The filter in accordance with claim 1, wherein the differentiation block has two serially arranged differentiation stages configured to subtract the intermediate signal $S_R$, which is delayed by a pre-defined number of time units, from the undelayed intermediate signal $S_R$.

8. The filter in accordance with claim 7, wherein the differentiation stages are configured to delay the intermediate signal $S_R$ by 4 or 8 time units.

9. The filter in accordance with claim 1, wherein the paralleling hardware block, integration hardware block, and differentiation hardware block are components of a field programmable gate array (FPGA).

10. A radar sensor for a missile, comprising:
a radar receiver;
an A/D converter configured to convert an analog signal from the radar receiver to a digital signal; and
a digital signal processor that includes a digital filter configured to reduce a sampling rate of an input signal, the digital filter including
a parallelizing hardware block configured to split the input signal into at least two parallel raw signals $u_e$;
an integration hardware block configured to convert the parallel raw signals $u_e$ into an intermediate signal $S_R$;
a differentiation hardware block configured to generate an output signal by differentiating the intermediate signal $S_R$;
wherein the integration hardware block includes a logic block configured to generate two parallel sum signals $S_0$ and $S_1$ in accordance with $$S_0(i) = \sum_{e=0}^{E-1} u_e(i),$$

$$i = 1, 2, \ldots$$

and $$S_1(i) = E \cdot u_0(i) + \cdots + 2 \cdot u_{E-2}(i) + u_{E-1}(i),$$

$$i = 1, 2, \ldots$$

from the parallel raw signals $u_e$ using summation operations, wherein $u_e(i)$ is the parallel raw signals and E is the number of parallel raw signals, and
wherein the integration hardware block includes a recursion block configured to generate the intermediate signal $S_R$ recursively from the parallel sum signals $S_0$ and $S_1$.

11. A method for operating a digital filter, the method comprising the steps:
   splitting, by a parallelizing hardware block, an input signal into at least two parallel raw signals $u_e$;
   adding, by an integration hardware block, the parallel raw signals $u_e$ to two parallel sum signals $S_0$ and $S_1$ in accordance with $$S_0(i) = \sum_{e=0}^{k-1} u_e(i),$$

$i = 1, 2, \ldots$ and $$S_1(i) = E \cdot u_0(i) + \cdots + 2 \cdot u_{E-2}(i) + u_{E-1}(i),$$

$i = 1, 2, \ldots$ wherein $u_e(i)$ is the parallel raw signals and E is the number of parallel raw signals;
   recursively generating, by the integration hardware block, an intermediate signal $S_R$ from the parallel sum signals $S_0$ and $S_1$; and
   generating, by a differentiation hardware block, an output signal y by differentiating the intermediate signal $S_R$,
   wherein the method reduces a sampling rate for the input signal.

12. The method in accordance with claim 11, wherein the parallel sum signals $S_0$ and $S_1$ at a sampling time are generated from the parallel raw signals at the same sampling time.

13. The method in accordance with claim 11, wherein the recursion block is configured to generate the intermediate signal $S_R$ at a sampling time from the parallel sum signals $S_0$ and $S_1$ at the sampling time and at least one preceding sampling time.

14. The method in accordance with claim 11, wherein the parallel sum signals $S_0$ and $S_1$ are delayed by one or two time units, and wherein the recursion block is configured to generate the intermediate signal $S_R$ at a sampling time from the parallel sum signals $S_0$ and $S_1$ at the sampling time and from the parallel sum signals $S_0$ and $S_1$ that are delayed by the one or two time units.

15. The method in accordance with claim 11, wherein the recursion block is configured to generate the intermediate signal $S_R$ in accordance with $$S_R(i)=S_R(i-1)+S_1(i)+E\cdot S_0(i-2)+E\cdot S_0(i-1), i=3,4,\ldots$$

wherein $S_0$ and $S_1$ are the recursion signals and E is the number of parallel raw signals $u_e$.

16. The method in accordance with claim 11, wherein the parallelizing block is configured to split the input signal into at least four parallel raw signals $u_e$.

17. The method in accordance with claim 11, wherein the differentiation block has two serially arranged differentiation stages configured to subtract the intermediate signal $S_R$, which is delayed by a pre-defined number of time units, from the undelayed intermediate signal $S_R$.

18. The method in accordance with claim 17, wherein the differentiation stages are configured to delay the intermediate signal $S_R$ by 4 or 8 time units.

* * * * *